(12) United States Patent
Farnworth

(10) Patent No.: US 7,785,915 B2
(45) Date of Patent: Aug. 31, 2010

(54) WAFER LEVEL METHOD OF LOCATING FOCAL PLANE OF IMAGER DEVICES

(75) Inventor: Warren Farnworth, Nampa, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/554,243

(22) Filed: Oct. 30, 2006

(65) Prior Publication Data

US 2008/0102552 A1 May 1, 2008

(51) Int. Cl.
*H01L 21/00* (2006.01)
*H01L 21/30* (2006.01)

(52) U.S. Cl. .......................... 438/67; 438/69; 438/456; 438/458; 257/E27.13

(58) Field of Classification Search ................ 438/28, 438/60, 64–69, 80; 257/432
See application file for complete search history.

(56) References Cited

U.S. PATENT DOCUMENTS

| | | | | |
|---|---|---|---|---|
| 6,492,699 | B1 * | 12/2002 | Glenn et al. ................. | 257/433 |
| 6,740,870 | B1 | 5/2004 | Doudoumopoulos ........ | 250/239 |
| 7,068,432 | B2 | 6/2006 | Boettiger et al. ............ | 359/619 |
| 2005/0007485 | A1 * | 1/2005 | Vook et al. .................. | 348/345 |
| 2005/0176168 | A1 * | 8/2005 | Yee .............................. | 438/68 |
| 2005/0231626 | A1 | 10/2005 | Tuttle et al. ................. | 348/340 |
| 2005/0274883 | A1 * | 12/2005 | Nagano ....................... | 250/239 |
| 2006/0027740 | A1 * | 2/2006 | Glenn et al. ................. | 250/239 |
| 2006/0043262 | A1 | 3/2006 | Akram ...................... | 250/208.1 |
| 2006/0044433 | A1 | 3/2006 | Akram ........................ | 348/294 |
| 2006/0284215 | A1 * | 12/2006 | Maeda et al. ............... | 257/215 |
| 2007/0009223 | A1 * | 1/2007 | Rudmann et al. ........... | 385/147 |
| 2007/0267647 | A1 * | 11/2007 | Lee et al. ..................... | 257/99 |

OTHER PUBLICATIONS

"Cure" Dictionary Entry, Academic Press of Science and Technology, 1992.*

* cited by examiner

Primary Examiner—Hsien-ming Lee
Assistant Examiner—Kevin Parendo
(74) Attorney, Agent, or Firm—Dickstein Shapiro LLP

(57) ABSTRACT

A method is disclosed which includes providing an imager substrate comprised of at least one imager device, providing a transparent substrate, forming a plurality of standoff structures on one of the imager substrate and the transparent substrate, the standoff structures having a width, forming an adhesive material having an initial thickness on a surface on at least one of the standoff structures, the adhesive material having an initial width that is less than the width of the standoff structures, and urging one of the imager substrate and the transparent substrate toward the other until such time as the imager substrate and the transparent substrate are in proper focal position relative to one another, the urging causing the initial thickness of the adhesive material to be reduced to a final thickness that is less than the initial thickness.

18 Claims, 14 Drawing Sheets

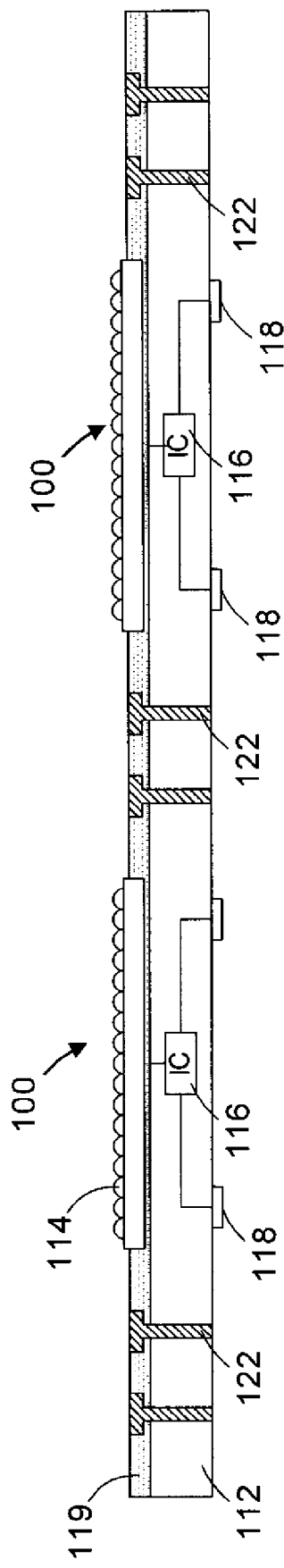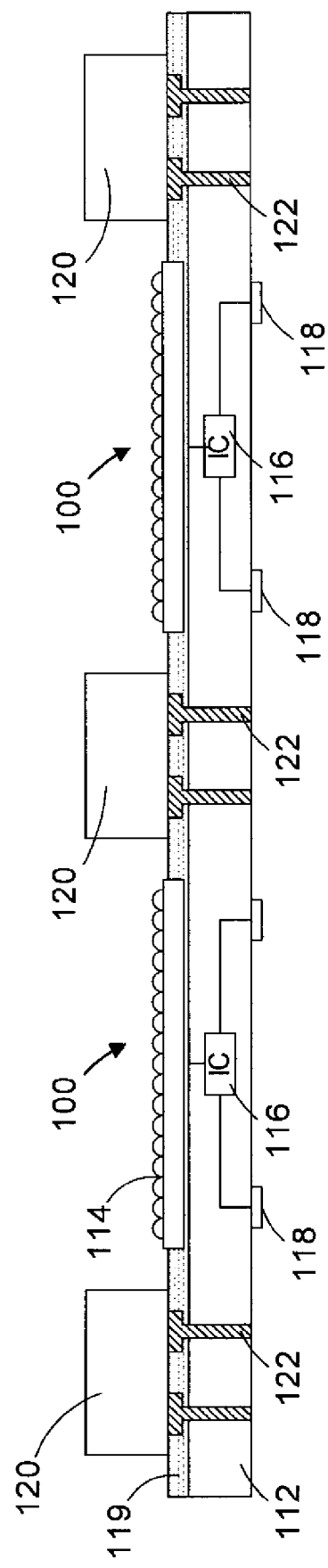

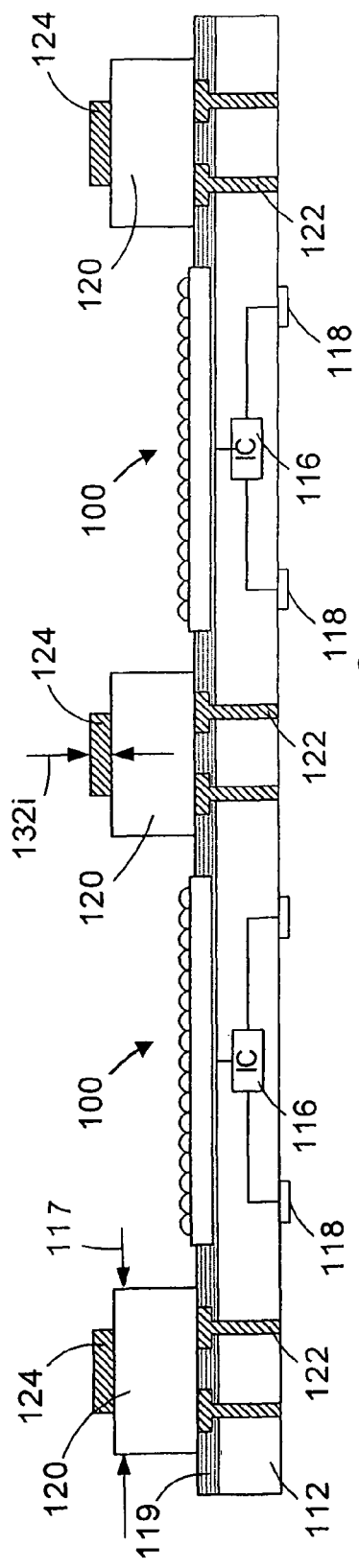
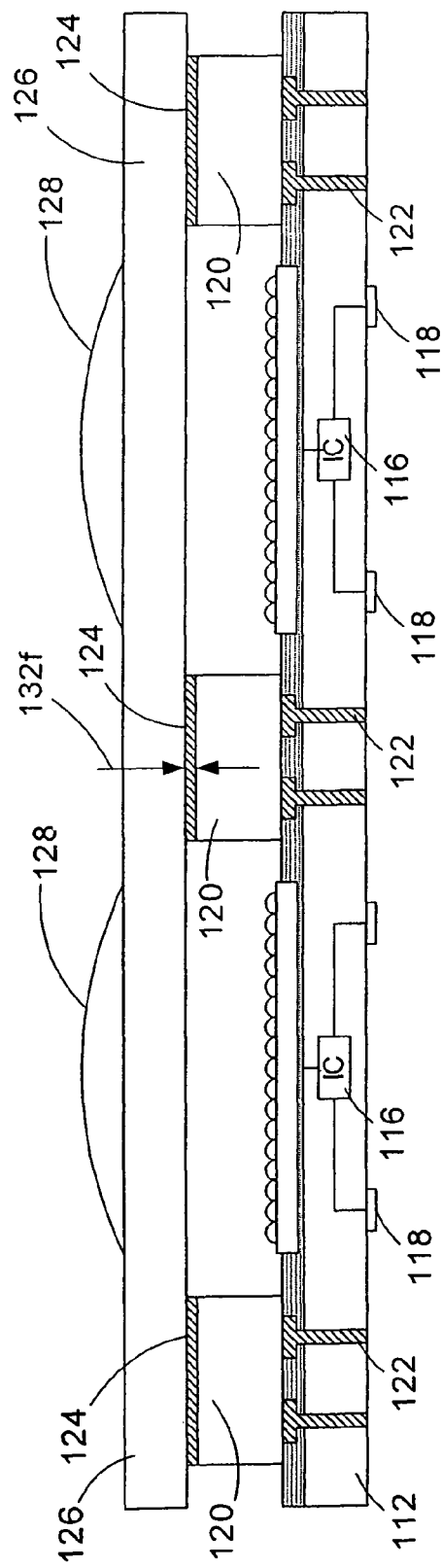

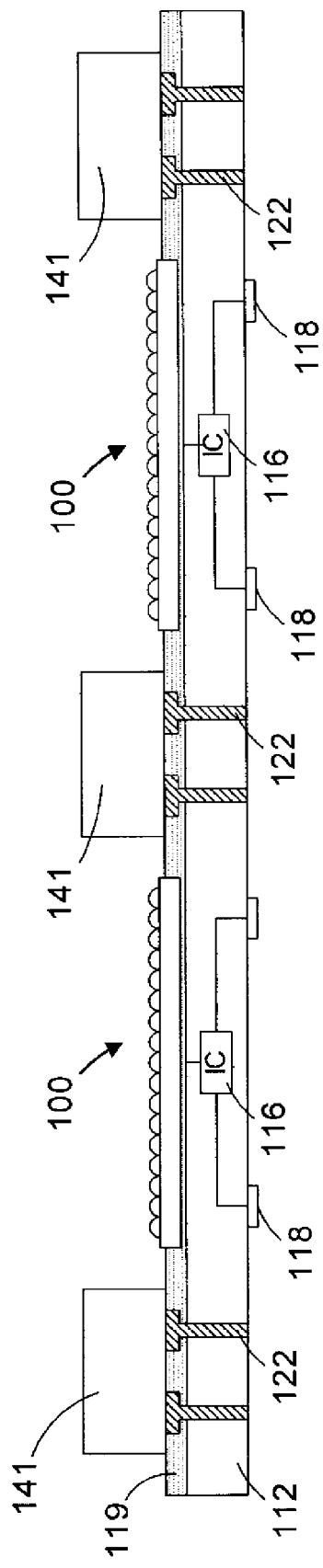
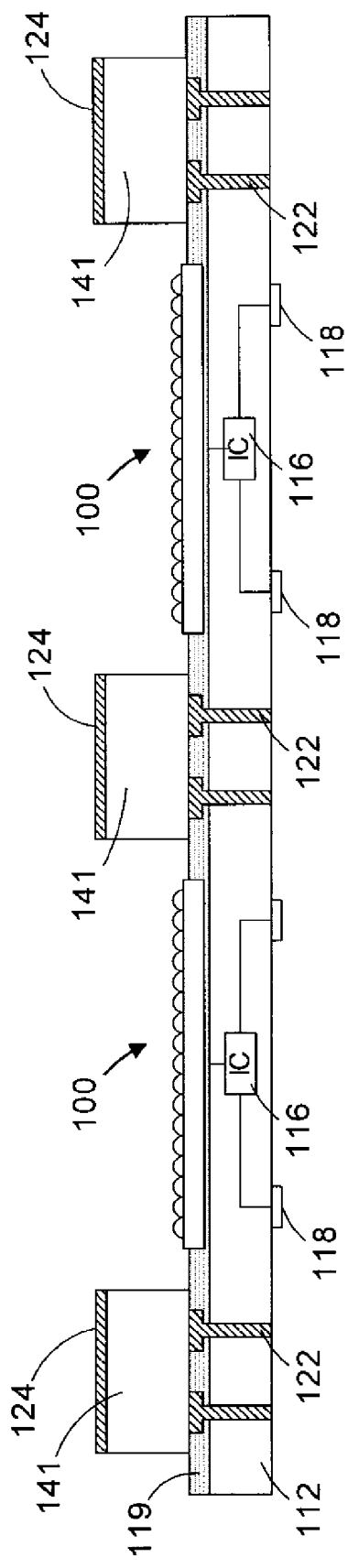
Figure 3A
Figure 3B

WAFER LEVEL METHOD OF LOCATING FOCAL PLANE OF IMAGER DEVICES

BACKGROUND OF THE INVENTION

1. Field of the Invention

The present invention is generally directed to the field of microelectronic imager devices and methods of manufacturing such devices.

2. Description of the Related Art

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because of their relative lower production costs, higher yields and smaller sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer 20 attached to the die 10 and a housing 30 attached to the interposer 20. The housing 30 surrounds the periphery of the die 10 and has an opening 32. The imager 1 also includes a transparent cover 40 over the die 10.

The die 10 includes an array of image sensors 12 and a plurality of bond pads 14 that are electrically coupled to the array of image sensors 12. The interposer 20 is typically a dielectric fixture having a plurality of bond pads 22, a plurality of ball pads 24 and traces 26 electrically coupling bond pads 22 to corresponding ball pads 24. The ball pads 24 are arranged in an array for surface mounting the imager 1 to a printed circuit board or module of another device. The bond pads 14 on the die 10 are electrically coupled to the bond pads 22 on the interposer 20 by wire bonds 28 to provide electrical pathways between the bond pads 14 and the ball pads 24. The interposer 20 can also be a lead frame or ceramic housing.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that it is difficult to accurately align the lens with the image sensor. Referring to FIG. 1, the centerline of the lens 70 should be aligned with the centerline of the image sensor 12 within very tight tolerances. For example, as microelectronic imagers have higher pixel counts and smaller sizes, the centerline of the lens 70 is often required to be within 50 mm of the centerline of the image sensor 12. This is difficult to achieve with conventional imagers because the support 50 may not be positioned accurately on the housing 30, and the barrel 60 is manually threaded onto the support 50. Therefore, there is a need to align lenses with image sensors with greater precision in more sophisticated generations of microelectronic imagers.

Another problem of packaging conventional microelectronic imagers is that positioning the lens 70 at a desired focus distance from the image sensor 12 is time-consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator rotates the barrel 60 by hand while watching the output of the imager 1 on a display until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time-consuming and subject to operator errors.

Yet another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. Moreover, the support 50 and barrel 60 are assembled separately for each die 10 individually after the dies have been singulated from a wafer and attached to the interposer substrate 20. Therefore, there is a significant need to enhance the efficiency, reliability and precision of packaging microelectronic imagers.

The present invention is directed to a device and various methods that may solve, or at least reduce, some or all of the aforementioned problems.

BRIEF DESCRIPTION OF THE DRAWINGS

The invention may be understood by reference to the following description taken in conjunction with the accompanying drawings, in which like reference numerals identify like elements, and in which:

FIG. 2A depicts an illustrative imager device at an intermediate stage of manufacture;

FIG. 2B depicts the structure of FIG. 2A having a plurality of standoff structures formed thereabove;

FIG. 2C depicts the structure in FIG. 2B with an adhesive material formed above the standoff structures;

FIG. 2D depicts the structure of FIG. 2C with a transparent substrate formed thereabove;

FIG. 3A depicts another illustrative embodiment of a partially formed imager device having a plurality of standoff structures formed thereabove;

FIG. 3B depicts the structure shown in FIG. 3A with an adhesive material positioned above the standoff structures;

Figure 1:
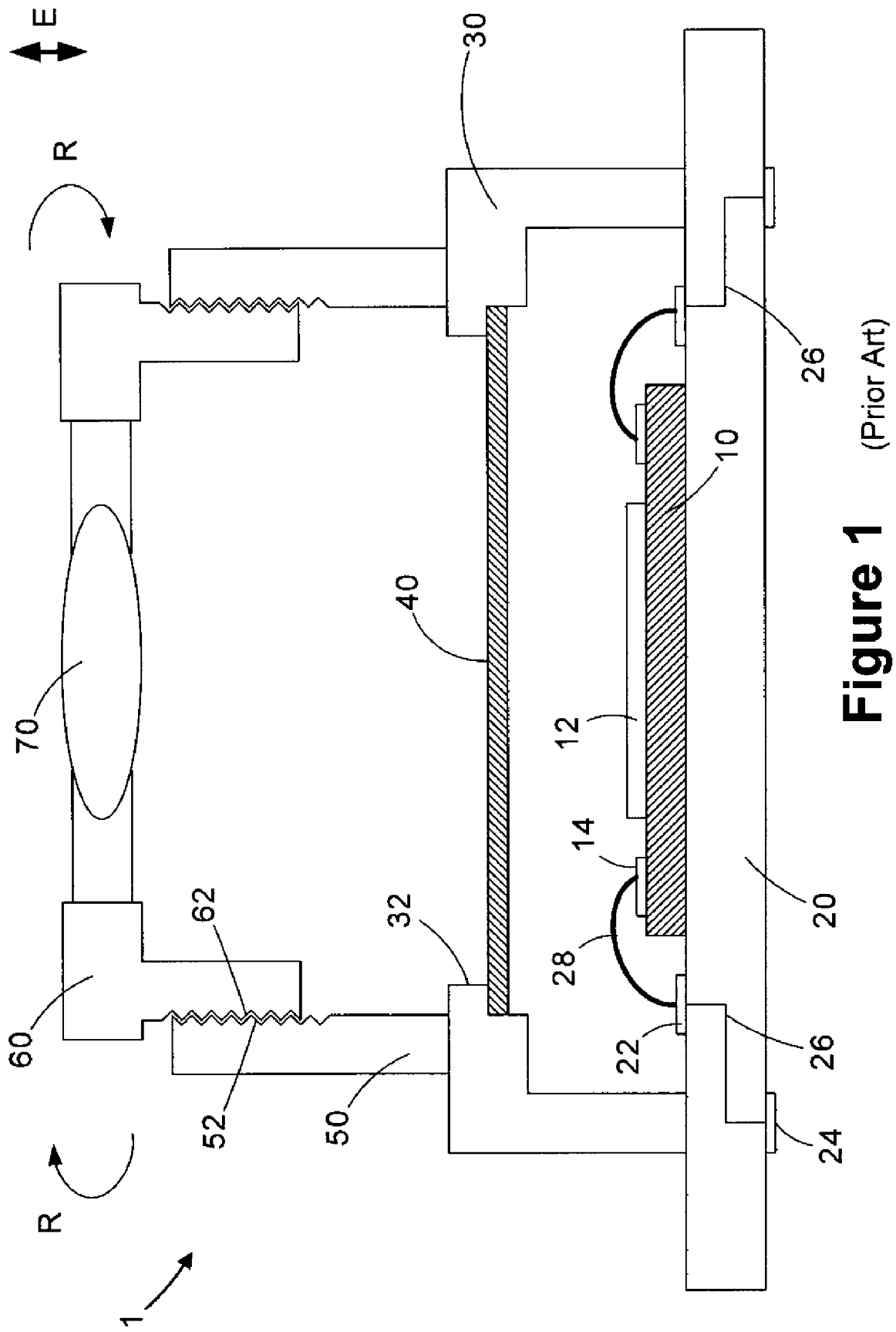
FIG. 1 is a schematic depiction of an illustrative prior art imager device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. For purposes of clarity and explanation, the relative sizes of the various features depicted in the drawings may be exaggerated or reduced as compared to the actual size of those features or structures. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be explicitly set forth in the specification in a definitional manner that directly and unequivocally provides the special definition for the term or phrase.

Figure 2E:
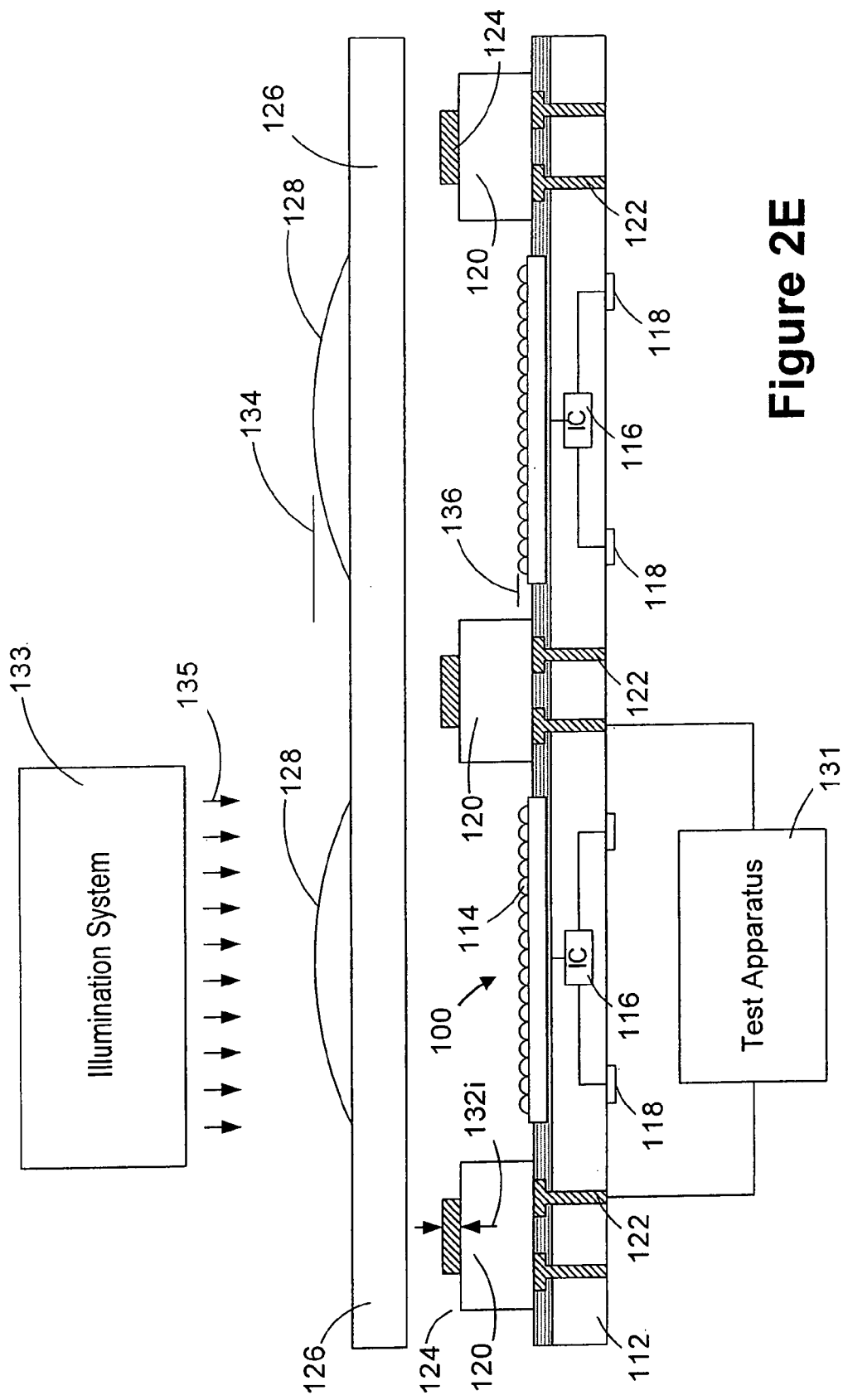
FIGS. 2E and 2F depict an illustrative technique for positioning the transparent substrate above the structure depicted in FIG. 2C.

FIGS. 2A-2F depict one illustrative technique for properly positioning a transparent substrate above a substrate comprised of a plurality of imager devices. FIG. 2A depicts a plurality of illustrative CMOS imager devices 100 formed on an imager substrate 112. Although only two imager devices 100 are depicted in the drawings, those skilled in the art will appreciate that there may be hundreds of such imager devices 100 formed across the surface of the imager substrate 112. The imager substrate 112 may be any of a variety of materials, e.g., silicon, silicon germanium, an SOI structure, etc. The imager devices 100 may be formed in accordance with processing techniques that are well known to those skilled in the art. The imager devices 100 typically comprise an array of photosensitive elements 114, internal circuitry 116 and bond pads 118. The bond pads 118 are adapted to be electrically coupled to another structure, such as a printed circuit board (not shown).

As shown in FIG. 2B, a plurality of standoff structures 120 are formed above the imager substrate 112. The standoff structures 120 may be formed by a variety of known techniques, and they may be made from a variety of materials, such as silicon, silicon dioxide, polymer, glass, etc. The size and configuration of the standoff structures 120 may vary depending upon the particular application.

A conductive layer 119 is formed above the imager substrate 112. The conductive layer 119 may be comprised of a variety of materials, e.g., aluminum, titanium, copper, nickel, etc. The conductive layer 119 may be representative of a layer that covers substantially the entire imager substrate 112 or a conductive trace that is part of a patterned conductive layer. The conductive layer 119 may have a thickness ranging from approximately 100-300 Å up to several micrometers, and it may be formed by performing a variety of known deposition techniques, e.g., a sputter deposition process, a plating process, etc.

Also depicted in FIG. 2B are a plurality of conductive members 122 that extend through the imager substrate 112. Such conductive members 122 are sometimes referred to as through-wafer interconnects. These conductive members 122 may be formed using known techniques and materials. The conductive members 122 conductively engage the conductive layer 119. The size and configuration of the conductive members 122 may vary depending upon the particular application.

Next, as shown in FIG. 2C, in one illustrative embodiment, a layer of adhesive material 124 is formed above the standoff structures 120. The layer of adhesive material 124 is formed such that it covers less than the entire width 117 of the standoff structures 120. For example, the width of the layer of adhesive material 124 may be approximately 20-80% of the width 117 of the standoff structures 120. The initial thickness 132i of the layer of adhesive material 124 may vary from approximately 0.5-50 µm depending on the particular application. The layer of adhesive material 124 may be comprised of any of a variety of materials, e.g., epoxy, silicone, polyimide siloxane, etc. The layer of adhesive material 124 may be formed by performing a variety of known techniques, e.g., jetting, screen printing, stenciling, etc. In one particularly illustrative embodiment, the layer of adhesive material 124 is a layer of epoxy having a thickness of approximately 2-50 µm that is formed by a screen printing process.

Ultimately, as shown in FIG. 2D, a transparent substrate 126 will be positioned above the imager substrate 112 and secured in place by the layer of adhesive material 124. The transparent substrate 126 may be made from a variety of transparent materials, e.g., it may be comprised of glass or other material that allows the transmission of light to the imaging device 100. The transparent substrate 126 further comprises a plurality of optical lenses 128 that are employed to focus light on the photosensitive devices 114. It should be understood that the lenses 128 are intended to be representative in nature and may represent any form of optical devices, e.g., a filter, an aperture, etc. It should also be understood that the entirety of the transparent substrate 126 need not be transparent. Rather, only certain portions of the transparent substrate 126 need to be transparent, e.g., the portions adjacent the lens 128. Nevertheless, for ease of reference, the term "transparent substrate" will be used in the specification and the claims with this understanding.

Figure 2F:
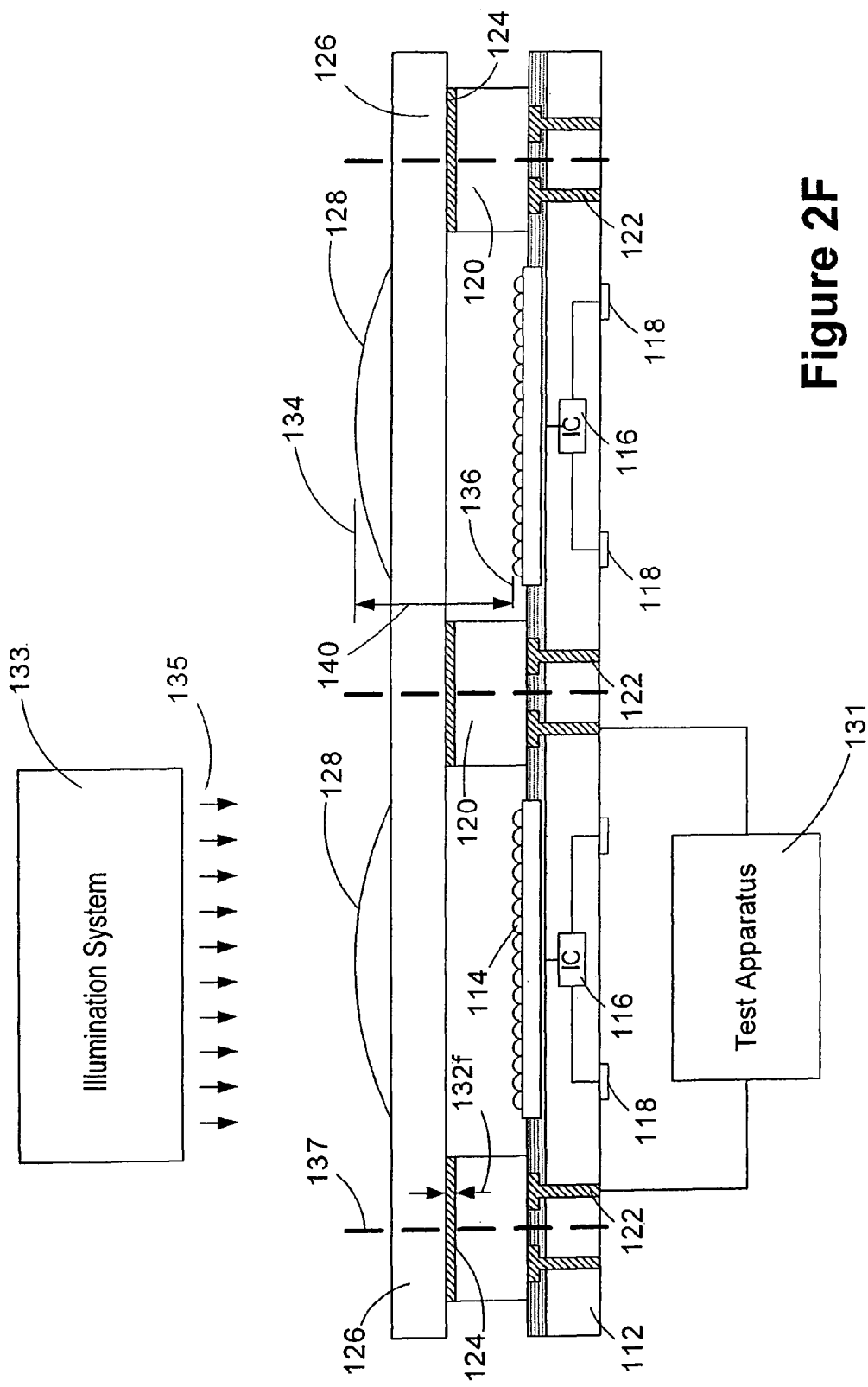

FIGS. 2E and 2F depict one illustrative technique for positioning the transparent substrate 126 at the proper focal position above the imager substrate 112. More specifically, FIGS.

2E-2F depict an illustrative technique for positioning the focal plane 134 of the lens 128 an appropriate distance 140 (see FIG. 2F) from the focal plane 136 of the imager device 100 such that incident light may be properly focused on the imager devices 100.

As shown in FIG. 2E, the transparent substrate 126 is positioned above the imager substrate 112. The transparent substrate 126 is properly oriented (x, y and z directions) relative to the imager substrate 112. The imager substrate 112 may be positioned on a wafer stage or chuck (not shown) and the transparent substrate 126 may be positioned and oriented above the imager substrate 112 using a variety of known techniques and tools (which are not shown so as not to obscure the present invention). For example, well-known probe testing equipment may be employed to urge the imager substrate 112 and the transparent substrate 126 together.

Also depicted in FIGS. 2E-2F is an illumination system 133 for generating light 135 to irradiate the photosensitive elements 114 of the imager device 100 being tested. A test apparatus 131 is used to determine when the focal plane 134 is at the proper distance 140 (see FIG. 2F) from the focal plane 136 of the imager device 100. In employing this technique, the initial thickness 132$i$ of the adhesive material 124 is greater than the final thickness 132$f$ (see FIG. 2F) of the adhesive layer 124 when the transparent substrate 126 is in its proper position. For example, the final thickness 132$f$ may be approximately 1-25 µm. Also note that the width of the initial layer of adhesive material 124 is less than the width 117 of the standoff structures so that, when the imager substrate 112 and transparent substrate 126 are pushed together, the adhesive material will have room to spread across substantially the entire width 117 of the standoff structure 120. This technique will also minimize or eliminate urging any adhesive material onto the photosensitive elements 114 of the imager devices 100.

As will be understood by those skilled in the art after a complete reading of the present application, the illumination system 133 and the testing apparatus 131 may be used to confirm the proper placement of the transparent substrate 126 at several different locations across the substrate 126. After the transparent substrate 126 is properly positioned, the adhesive material 124 may be allowed to dry or it may be cured depending upon the particular material employed. After the adhesive material 124 is dried or cured, the individual imager devices may be separated by cutting the devices along the illustrative cut lines 137 depicted in FIG. 2F. It should be understood that although the standoff structures 120 are depicted as being initially formed above the imager substrate 112, the standoff structures 120 could also be initially formed above the transparent substrate 126.

Figure 3C:
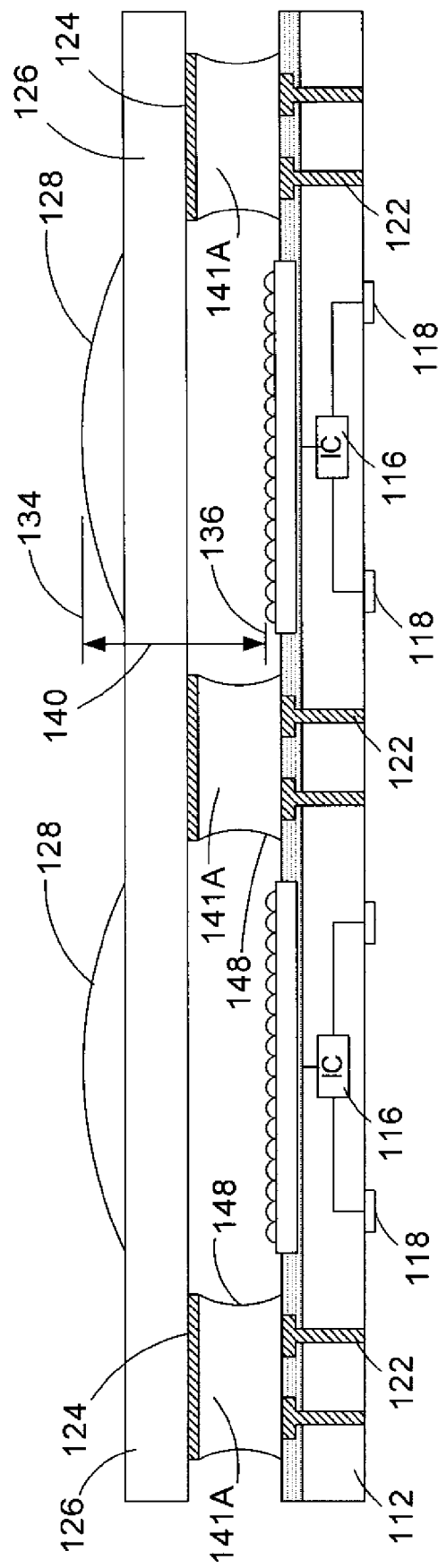
FIG. 3C depicts the structure shown in FIG. 3B with a transparent substrate positioned thereabove.

FIGS. 3A-3E depict another illustrative technique for positioning the transparent substrate 126 at the proper focal position above the imager devices 100 on the imager substrate 112. As shown in FIG. 3A, a plurality of standoff structures 141 having an initial configuration are formed above the imager substrate 112. The standoff structures 141 may have any desired shape or configuration. The standoff structures 141 are made of a pliable material that exhibits some degree of flexibility after it is initially formed. By "pliable," it is meant that the originally formed standoff structures 141 have sufficient rigidity to permit handling and maintain their shape, but may be deformed upon the application of pressure or force. The standoff structures 141 may be initially cured to this pliable state by a variety of known techniques, e.g., UV radiation, heating, etc. For example, the standoff structures 141 may be comprised of a b-staged material that, after its initial formation, may be cured or dried to a different state that exhibits different characteristics. As shown in FIG. 3B, a layer of adhesive material 124 may be formed above the standoff structures 141. In specific illustrative embodiments, the standoff structures 141 may be made of epoxy, polymers, silicon and metals.

FIG. 3C depicts the imager substrate 112 with the transparent substrate 126 positioned thereabove at its proper focal position, as reflected by the dimension 140. Note that, in this position, the standoff structures 141 have been deformed to standoff structure 141A. The deformation of the original standoff structure 141, as originally formed, is due to the pliable nature of the material comprising the standoff structure 141. The material of the standoff structure 141 is sufficiently pliable such that it deforms enough to accommodate changes in the position of the transparent substrate 126 such that it may be properly located at the desired focal position relative to the imager devices 100.

Figure 3D:
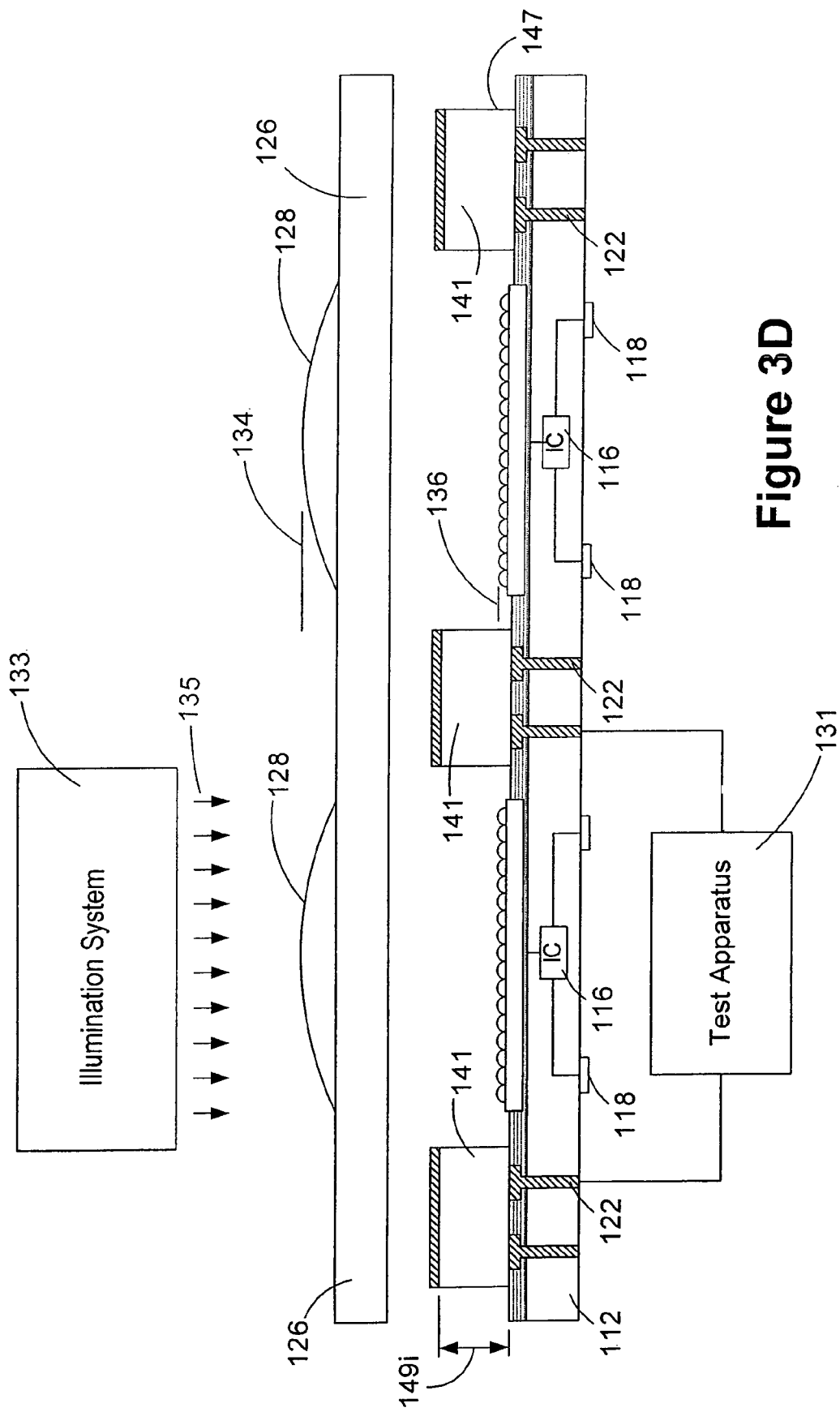
FIGS. 3D and 3E depict one illustrative technique for positioning the transparent substrate above the structure shown in FIG. 3B.
Figure 3E:
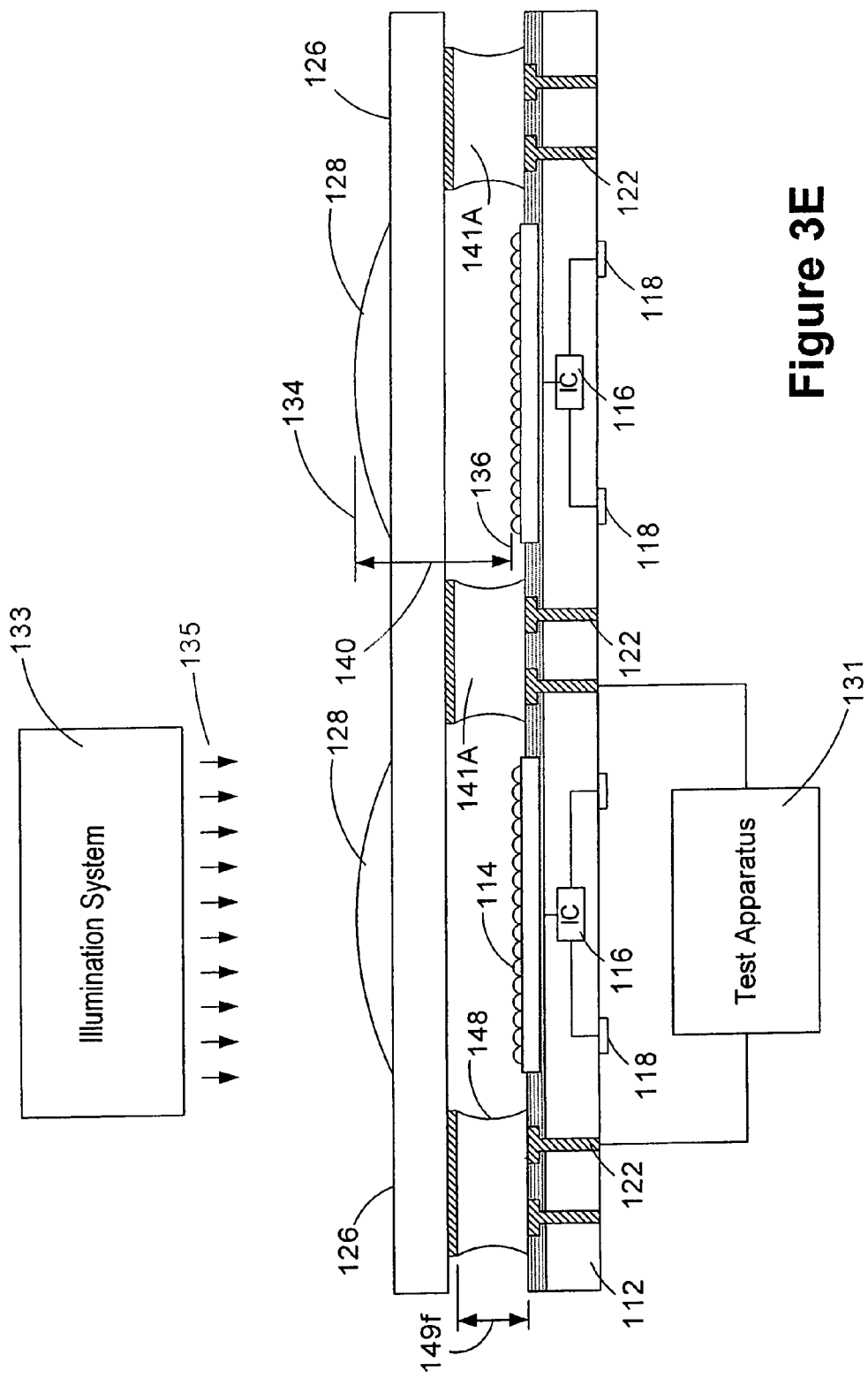

FIGS. 3D-3E depict an illustrative example of this technique. As shown in FIG. 3D, the standoff structure 141 has an initial height 149$i$ and substantially vertical sidewalls 147. As with the earlier embodiment depicted in FIGS. 2E and 2F, the illumination system 133 and testing apparatus 131 may be employed to confirm the positioning of the transparent substrate 126 at the desired focal position. More specifically, the transparent substrate 126 is urged downward, either mechanically or manually, and the standoff structure 141 begins to deform. The transparent substrate 126 is urged further downward until such time as the focal plane 134 of the transparent substrate 126 is in the proper position, as reflected by the arrow 140, relative to the imager device 100. In this position, the original standoff structure 141 has assumed a deformed configuration that is different from its original shape. In the illustrative example depicted herein, the deformed standoff structure 141A has a height 149$f$ and non-vertical sidewalls 148. Of course, the exact shape of the deformed standoff structure 141A relative to the original standoff structure 141 may vary. In one illustrative embodiment, the dimension 149$i$ may be approximately 50-110 µm while the dimension 149$f$ may be approximately 45-100 µm. It should be understood that although the standoff structures 141 are depicted as being initially formed above the imager substrate 112, the standoff structures 141 could also be initially formed above the transparent substrate 126.

Figure 4A:
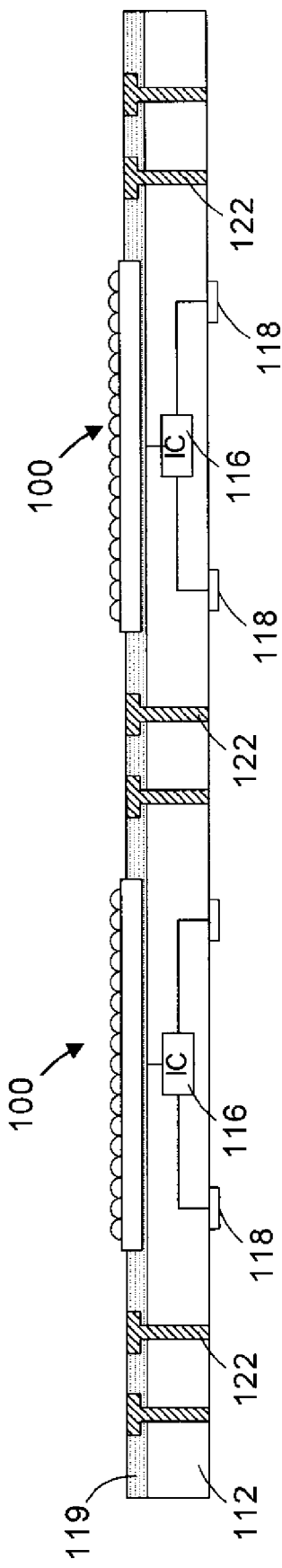
FIG. 4A depicts an illustrative embodiment of a partially formed imager device.
Figure 4B:
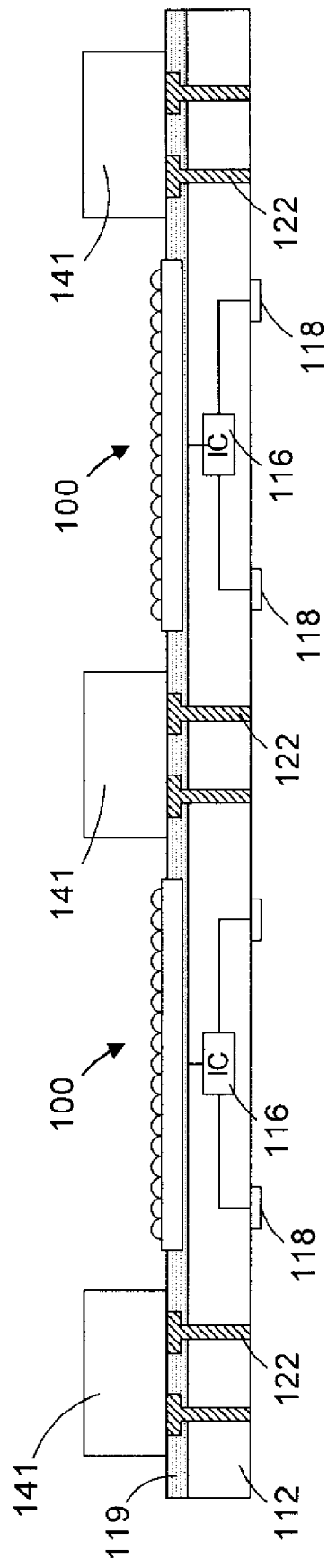
FIG. 4B depicts the formation of a plurality of standoff structures above the structure depicted in FIG. 4A.

FIGS. 4A-4G depict yet another illustrative technique for positioning a transparent substrate 126 above an imager substrate 112. FIG. 4A depicts an illustrative imager substrate 112 comprised of a plurality of imager devices 100. Several of the imager devices 100 may be formed across the imager substrate 112. As shown in FIG. 4B, a plurality of standoff structures 141 are formed above the imager substrate 112. The standoff structures 141 are comprised of a pliable material as described previously.

Figure 4C:
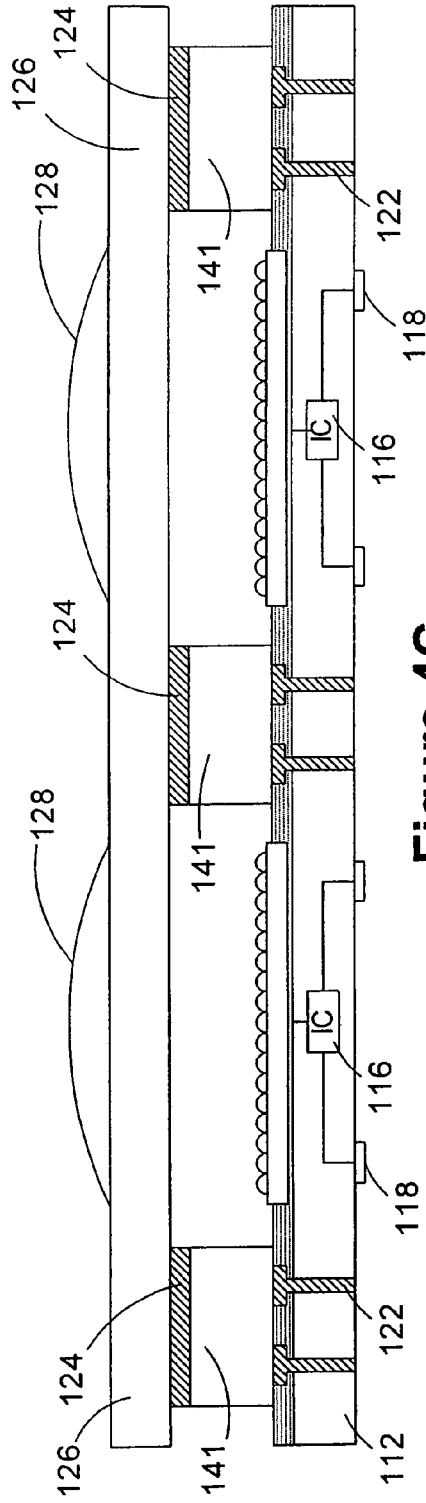
FIG. 4C depicts the structure of FIG. 4B with a transparent substrate positioned thereabove.
Figure 4D:
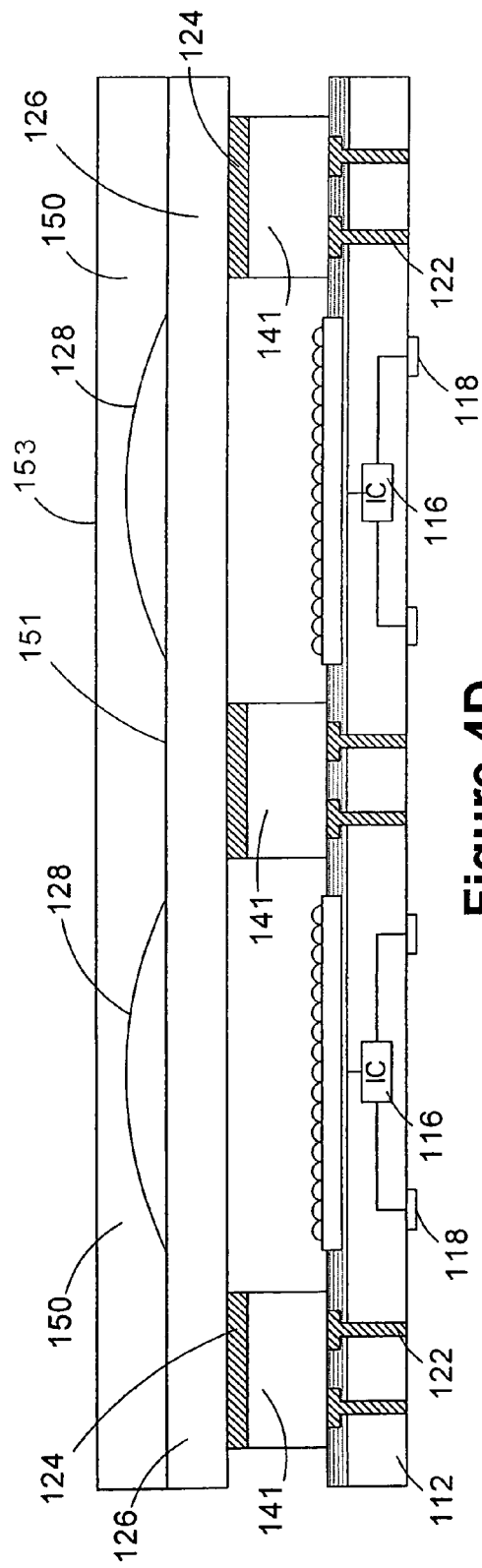
FIG. 4D depicts the structure of FIG. 4C with a layer of adhesive material formed above the transparent substrate.

As shown in FIG. 4C, a layer of adhesive material 124 is formed above the standoff structures 141 using known techniques and materials. The transparent substrate 126 is positioned above the imager substrate 112 and the adhesive material 124 secures the transparent substrate 126 in position. Next, as shown in FIG. 4D, a layer of adhesive material 150, e.g., dicing tape, etc., is positioned on the top surface 151 of the transparent substrate 126. The structure and nature of the adhesive material 150 may vary depending upon the particular application.

Figure 4E:
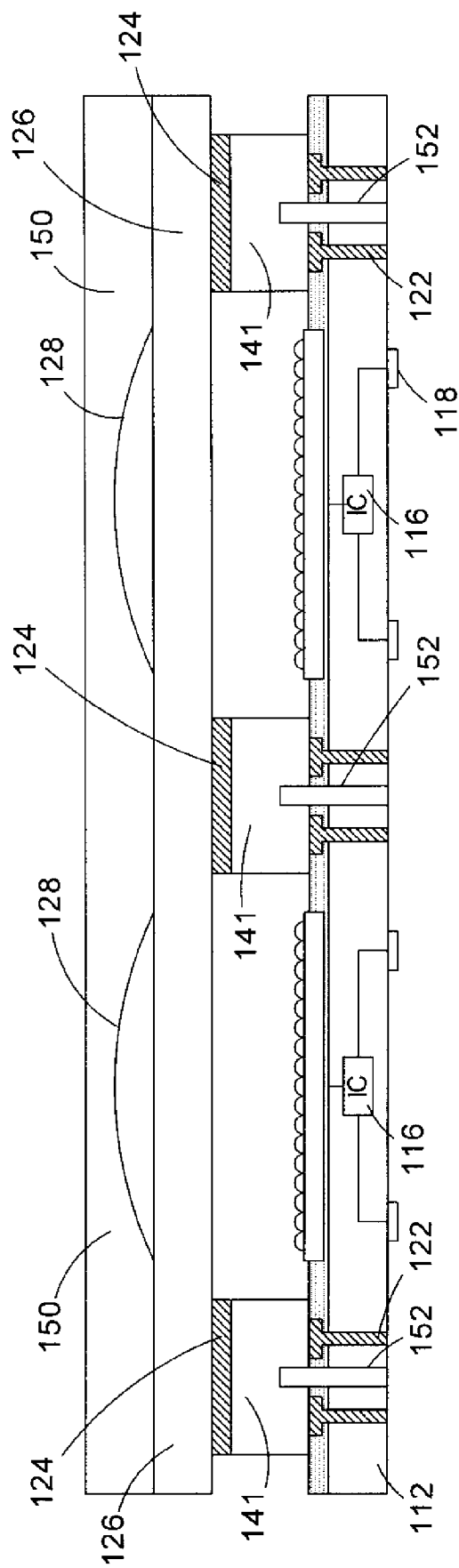
FIG. 4E depicts the structure of FIG. 4D with a plurality of grooves cut in the imager device substrate.

As shown in FIG. 4E, a cutting or dicing operation is performed to partially cut through the structure depicted in FIG. 4E, as reflected by the cut lines or slots 152. The slots 152 extend through the imager substrate 112 and into the standoff structure 141. The width and depth of the slot 152 may vary depending upon the particular application. The partial cutting process reflected in FIG. 4E may be performed with traditional dicing tools and equipment.

Figure 4F:
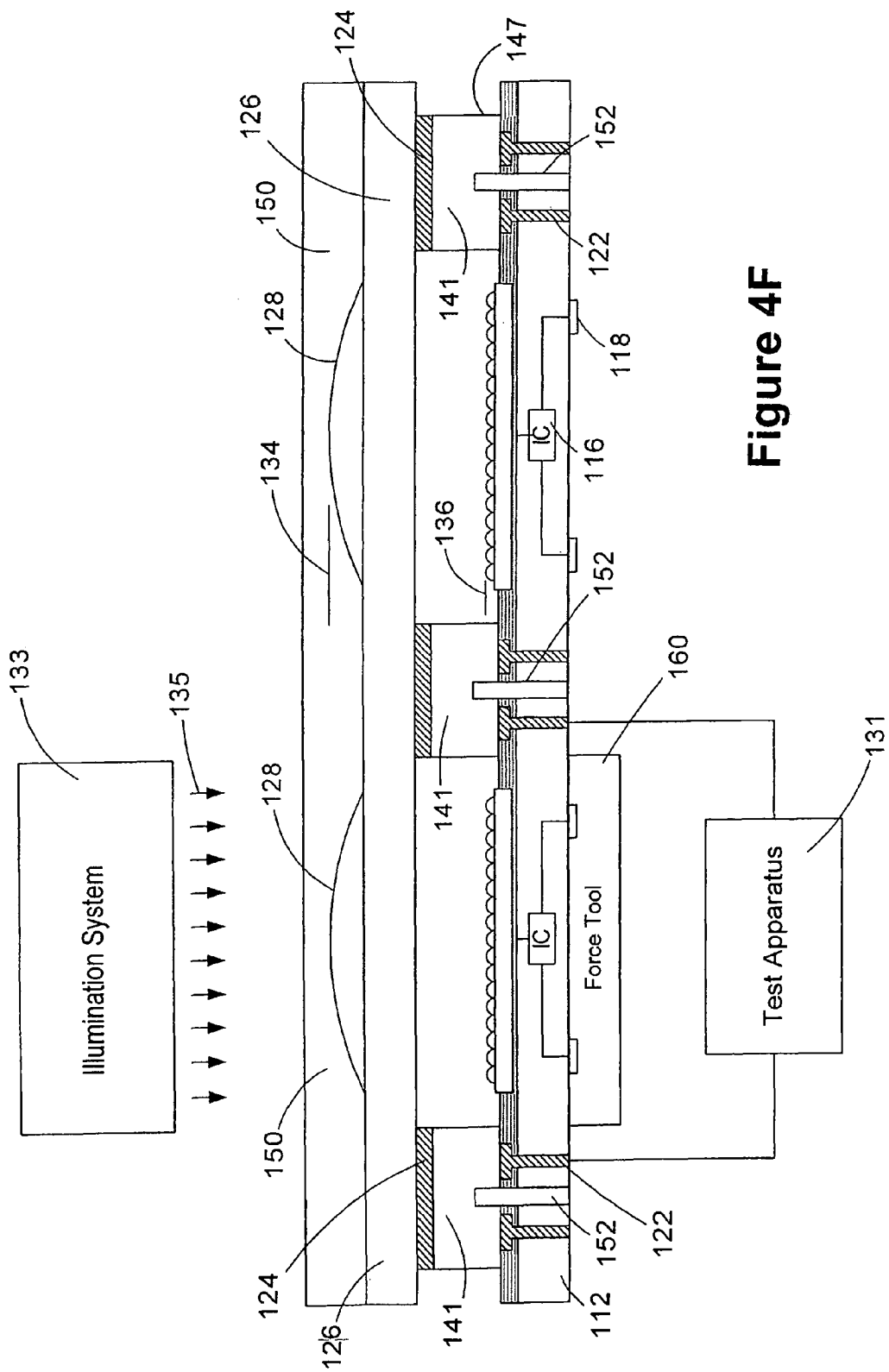
FIGS. 4F and 4G depict one illustrative technique for positioning the transparent substrate relative to the imager device on the imager device substrate.
Figure 4G:
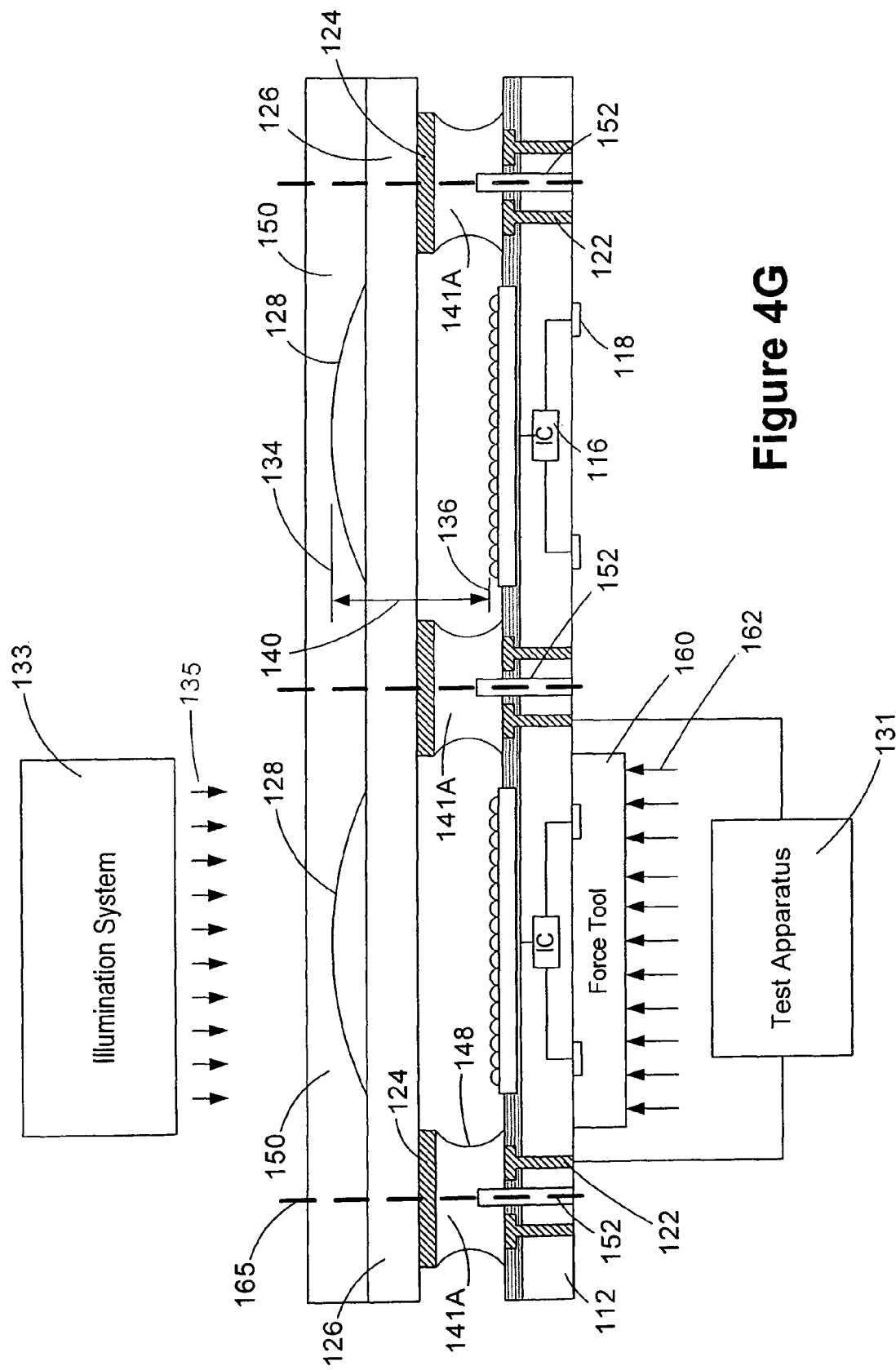

FIGS. 4F-4G depict an illustrative technique for properly positioning the focal plane 134 of the transparent substrate 126 at the proper position relative to the focal plane 136 of the imager devices 100. As mentioned previously, a test apparatus 131 is coupled to a particular imager device 100 and the illumination system 133 directs light 135 toward the imager device 100. A force generating tool 160 is used to urge the imager device 100 upward (as indicated by arrows 162 in FIG. 4G) until such time as the transparent substrate 126 is at the proper focal position, as reflected by the dimension 140 in FIG. 4G.

Note that, as this process begins, the standoff structures 141 are in their initially-formed, non-deformed state as reflected by the illustrative straight sidewalls 147 (see FIG. 4F). As the force tool 160 urges the subject portion of the imager substrate 112 upward, the standoff structures deform, due to the pliable nature of their material, to define standoff structures 141A having a deformed configuration. This deformation is reflected by the illustrative non-vertical sidewalls 148 (see FIG. 4G).

Once the proper relative positioning of the transparent substrate 126 and the imager substrate 112 is confirmed by the test apparatus 131, the subject portion of the image substrate 112 urged upward by the force tool 160 is maintained in position until such time as the deformed standoff structure 141A is dried or cured so as to assume this final position using a variety of techniques, e.g., UV radiation, heating, etc. After each of the imager die across the imager substrate 112 are subjected to this process, the assembly may be cut along lines 165 to completely separate the individual imager die.

Note that the relative vertical positioning of the transparent substrate 126 above the imager substrate 112 in FIGS. 4F-4G is provided by way of example only to schematically depict the process disclosed herein. In some cases, the imager substrate 112/transparent substrate 126 combination may be inverted. For example, the surface 153 (see FIG. 4D) of the adhesive material 150 may be positioned face down on a transparent wafer chuck (not shown). The illumination system 133 may direct incident light 135 upward toward the imager device 100. The testing apparatus 131 would be coupled to the back side of the inverted imager substrate 112. It should be understood that although the standoff structures 141 are depicted as being initially formed above the imager substrate 112, the standoff structure 141 could also be initially formed above the transparent substrate 126.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
providing an imager substrate comprising a plurality of imager devices;
providing a transparent substrate;
forming a plurality of standoff structures on one of the imager substrate and the transparent substrate, each standoff structure corresponding to at least one of the plurality of imager devices and being formed of a curable material;
adhesively coupling the imager substrate and the transparent substrate to one another by forming an adhesive material on a surface on at least one of the standoff structures;
urging one of the imager substrate and the transparent substrate toward the other, the urging causing the standoff structures to deform into a deformed configuration;
concurrently with the urging, determining a focal position of the imager substrate and the transparent substrate relative to one another;
subsequent to the urging, fixing relative positions of the imager substrate and the transparent substrate at the focal position relative to one another; and
performing a cutting operation prior to the step of urging one of the imager substrate and the transparent substrate toward the other, the cutting operation defining a plurality of cut lines, each of which extends through one of the imager substrate and the transparent substrate and extends partially into the standoff structures adjacent to one of the plurality of imager devices,
wherein the standoff structures, as initially formed, are pliable and have an initial configuration having an initial height, and wherein the urging causes the standoff structures to assume the deformed configuration when the imager substrate and the transparent substrate are at the focal position, the deformed configuration being different than the initial configuration and having a reduced height relative to the initial height and wherein the step of fixing the relative positions further comprises curing the standoff structures such that they remain in the deformed configuration.

2. The method of claim 1, wherein the step of fixing the relative positions further comprises curing the adhesive material to adhesively couple the imager substrate and transparent substrate to one another with the standoff structures in the deformed configuration.

3. The method of claim 1, wherein the standoff structures having the deformed configuration have a non-vertical sidewall.

4. The method of claim 1, further comprising dicing the imager substrate and the transparent substrate so as to form a plurality of imager die.

5. The method of claim 1, wherein the step of forming the plurality of standoff structures comprises forming the plurality of standoff structures on the imager substrate.

6. The method of claim 1, wherein the step of forming the plurality of standoff structures comprises forming the plurality of standoff structures on the transparent substrate.

7. The method of claim 1, wherein the transparent substrate comprises a plurality of lenses, apertures, or filters.

8. The method of claim 1, wherein the initial height of the standoff structures is approximately 50-110 μm.

9. The method of claim 1, wherein the reduced height of the standoff structures having the deformed configuration is approximately 45-100 μm.

10. The method of claim 1, wherein the standoff structures are comprised of a b-staged material.

11. The method of claim 1, wherein the standoff structures are comprised of at least one of an epoxy, a silicon; and a polymer.

12. The method of claim 1, wherein the standoff structures have a width, the adhesive material has an initial thickness and an initial width that is less than the width of the standoff structures, and the urging causes the initial thickness of the adhesive material to be reduced to a final thickness that is less than the initial thickness.

13. The method of claim 12, wherein the step of fixing the relative positions further comprises curing the adhesive material to adhesively couple the imager substrate and transparent substrate to one another.

14. The method of claim 12, wherein the initial thickness of the adhesive material is approximately 2-50 µm.

15. The method of claim 12, wherein the final thickness of the adhesive material is approximately 1-25 µm.

16. The method of claim 12, wherein the initial width of the adhesive material is approximately 20-80% of the width of the standoff structure.

17. The method of claim 12, wherein when the adhesive material is at its final thickness it has a final width that does not exceed the width of the standoff structure.

18. The method of claim 12, wherein when the adhesive material is at its final thickness it has a final width that is greater than the initial width of the adhesive material.

* * * * *